(12) United States Patent  
Kroupenkine et al.

(10) Patent No.: US 7,323,033 B2
(45) Date of Patent: Jan. 29, 2008

(54) NANOSTRUCTURED SURFACES HAVING VARIABLE PERMEABILITY

(75) Inventors: Timofei Nikita Kroupenkine, Warren, NJ (US); Mary Louise Mandich, Martinsville, NJ (US); Joseph Ashley Taylor, Springfield, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 629 days.

(21) Appl. No.: 10/835,639

(22) Filed: Apr. 30, 2004

(65) Prior Publication Data

US 2005/0269743 A1 Dec. 8, 2005

(51) Int. Cl.
*B01D 53/22* (2006.01)

(52) U.S. Cl. .......................... 95/45; 95/46; 95/52; 96/4; 96/6; 96/10; 96/11; 96/12; 210/640; 210/644; 210/490; 210/500.21; 210/500.22

(58) Field of Classification Search .................. 96/4, 96/6, 7, 8, 10, 11, 12, 13, 14; 95/45, 52, 95/46; 210/640, 644, 650, 488, 490, 500.21, 210/500.22; 429/41, 44; 204/450
See application file for complete search history.

(56) References Cited

U.S. PATENT DOCUMENTS

| | | | |
|---|---|---|---|
| 5,948,255 A * | 9/1999 | Keller et al. ............ 210/500.22 |
| 6,185,961 B1 | 2/2001 | Tonucci et al. ............... 65/60.4 |
| 6,425,936 B1 * | 7/2002 | Sammons et al. ................ 96/4 |
| 6,569,225 B2 * | 5/2003 | Edmundson et al. ............. 96/4 |
| 6,685,810 B2 * | 2/2004 | Noca et al. ............ 210/500.22 |
| 6,810,899 B2 * | 11/2004 | Franz et al. .................... 96/11 |
| 6,913,697 B2 * | 7/2005 | Lopez et al. ................. 210/650 |
| 6,977,009 B2 * | 12/2005 | Pan et al. ......................... 96/7 |
| 7,108,813 B2 * | 9/2006 | Kang et al. ............ 210/500.25 |
| 2002/0115747 A1 | 8/2002 | Feldheim et al. ........... 523/201 |
| 2003/0080049 A1 | 5/2003 | Lee et al. ................... 210/483 |
| 2004/0173506 A1 * | 9/2004 | Doktycz et al. ............ 210/490 |
| 2005/0204920 A1 * | 9/2005 | Hong et al. ...................... 96/4 |

FOREIGN PATENT DOCUMENTS

WO WO 03/016040 2/2003

OTHER PUBLICATIONS

U.S. Appl. No. 10/798,064, filed Mar. 11, 2004, Arney, et al.

(Continued)

*Primary Examiner*—Jason M. Greene

(57) ABSTRACT

A nanostructured substrate is disclosed having a plurality of substrate openings disposed between the nanostructures on the substrate. When a desired fluid comes into contact with the substrate, at least a portion of the fluid is allowed to pass through at least one of the openings. In a first embodiment, the fluid is caused to pass through the openings by causing the fluid to penetrate the nanostructures. In a second embodiment, the substrate is a flexible substrate so that when a mechanical force is applied to the substrate, such as a bending or stretching force, the distance between nanoposts or the diameter of nanocells on the substrate increases and the liquid penetrates the nanostructures. In another embodiment, a first fluid, such as water, is prevented from penetrating the nanostructures on the substrate while a second fluid is permitted to pass through the substrate via the openings in the substrate.

16 Claims, 9 Drawing Sheets

OTHER PUBLICATIONS

U.S. Appl. No. 10/806,543, filed Mar. 23, 2004, Arney, et al.
U.S. Appl. No. 10/816,569, filed Apr. 1, 2004, Gasparyan, et al.
U.S. Appl. No. 10/674,448, filed Sep. 30, 2003, Hodes, et al.
U.S. Appl. No. 10/803,565, filed Mar. 18, 2004, Hodes, et al.
U.S. Appl. No. 10/803,641, filed Mar. 18, 2004, Hodes, et al.
U.S. Appl. No. 10/403,159, filed Mar. 31, 2003, Komblit, et al.
U.S. Appl. No. 10/649,285, filed Aug. 27, 2003, Komblit, et al.
U.S. Appl. No. 10/716,084, filed Nov. 18, 2003, Kroupenkine, et al.
U.S. Appl. No. 10/803,576, filed Mar. 18, 2004, Kroupenkine, et al.
U.S. Appl. No. 10/810,774, filed Mar. 26, 2004, Kroupenkine, et al.
Kim, et al., "*Nanostructured Surfaces for Dramatic Reduction of Flow Resistance in Droplet-Based Microfluidics*," IEEE, pp. 479-482 (2002).
Yoshikazu Homma, et al, "Aligned island formation using step-band networks on Si(111)," *Journal of Applied Physics, American Institution of Physics, NY*, vol. 86, No. 6, (Sep. 15, 1999), pp. 3083-3088.
Cecile Cottin-Bizonne, et al, "Low-friction flows of liquid at nanopatterned interfaces," *Nature Materials*, vol. 2, (Mar. 9, 2003), pp. 237-240.
Kenneth K. S. Lau, et al, "Superhydrophobic Carbon Nanotube Forests," *Nano Letters*, vol. 3, No. 12, (Oct. 22, 2003), pp. 1701-1705.
Masao Washizu, "Electrostatic Actuation of Liquid Droplets for Microreactor Applications," *IEEE Transactions on Industry Applications, IEEE Inc., NY*, vol. 34, No. 4, (Jul. 1998), pp. 732-737.
European Search Report, Appl. No. 05252369.3-2203 PCT/, (Sep. 29, 2005).

* cited by examiner

*FIG. 1*A
(PRIOR ART)
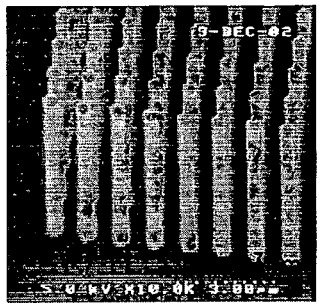
*FIG. 1*B
(PRIOR ART)
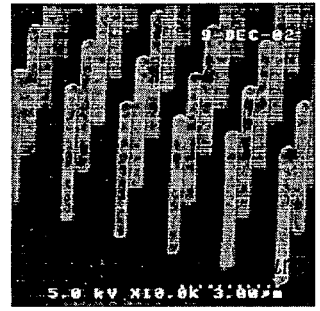
*FIG. 1*C
(PRIOR ART)
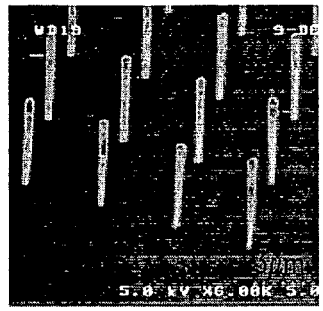
*FIG. 1*D
(PRIOR ART)
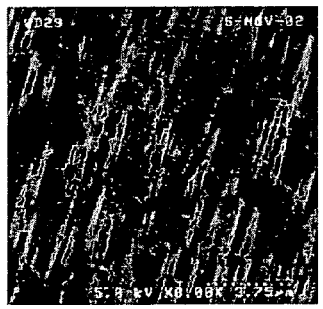
*FIG. 1*E
(PRIOR ART)
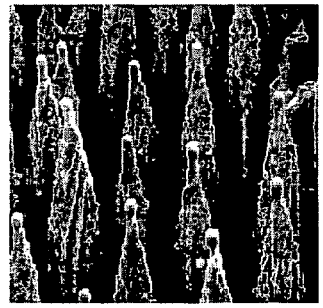

NANOSTRUCTURED SURFACES HAVING VARIABLE PERMEABILITY

FIELD OF THE INVENTION

The present invention relates generally to nanostructured or microstructured surfaces and, more particularly, nanostructured or microstructured surfaces having variable permeability.

BACKGROUND OF THE INVENTION

Many beneficial devices or structures in myriad applications are characterized at least in part by having a liquid or other fluid that is in contact with at least one solid surface or substrate. Many of these devices and applications are characterized by a liquid moving while in contact with a surface. Since the characteristics of both the liquid and the surface determine the interaction between the liquid and surface, it is often desirable to understand and control those characteristics to achieve control of the interaction of the liquid with those surfaces. For example, it is often desirable to control the flow resistance experienced by the liquid when it is in contact with the surface. Surfaces on which liquids or fluids exhibit a very low flow resistance are referred to herein as superhydrophobic surfaces.

FIGS. 1A-1E show different illustrative superhydrophobic surfaces produced using various methods. Specifically, these figures show substrates having small posts, known as nanoposts and/or microposts with various diameters and with different degrees of regularity. An illustrative method of producing nanoposts and microposts, found in U.S. Pat. No. 6,185,961, titled "Nanopost arrays and process for making same," issued Feb. 13, 2001 to Tonucci, et al, is hereby incorporated by reference herein in its entirety. Nanoposts have been manufactured by various methods, such as by using a template, by various means of lithography, and by various methods of etching.

When a droplet of liquid, such as water, is placed on a substrate having an appropriately designed nanostructured or microstructured feature pattern, the flow resistance experienced by the droplet is dramatically reduced as compared to a droplet on a substrate having no such nanostructures or microstructures. Surfaces having such appropriately designed feature patterns are the subject of the article titled "Nanostructured Surfaces for Dramatic Reduction of Flow Resistance in Droplet-based Microfluidics", J. Kim and C. J. Kim, IEEE Conf. MEMS, Las Vegas, Nev., January 2002, pp. 479-482, which is hereby incorporated by reference herein in its entirety. That reference generally describes how, by using surfaces with predetermined nanostructure features, the flow resistance to the liquid in contact with the surface can be greatly reduced. Specifically, the Kim reference teaches that, by finely patterning the surface in contact with the liquid, and using the aforementioned principle of liquid surface tension, a droplet of liquid disposed on the surface will be supported on the tops of the nanostructure pattern, as shown in FIG. 2. Referring to FIG. 2, droplet 201 of an appropriate liquid (depending upon the surface structure) will enable the droplet 201 to be suspended on the tops of the nanoposts 203 with no contact between the droplet and the underlying solid surface. This results in an extremely low area of contact between the droplet and the surface 202 (i.e., the droplet only is in contact with the top of each post 203) and, hence a low flow resistance.

In many applications, it is desirable to be able to control the penetration of a given liquid, such as the droplet 201 of FIG. 2, into a given nanostructured or microstructured surface, such as surface 202 in FIG. 2 and, thus, control the flow resistance exerted on that liquid as well as the wetting properties of the solid surface. FIGS. 3A and 3B show one embodiment in accordance with the principles of the present invention where electrowetting is used to control the penetration of a liquid into a nanostructured surface. Such electrowetting is the subject of copending U.S. patent application Ser. No. 10/403,159, filed Mar. 31, 2003, and titled "Method and Apparatus for Controlling the Movement of a Liquid on a Nanostructured or Microstructured Surface," which is hereby incorporated by reference herein in its entirety. Referring to FIG. 3A, a droplet 301 of conducting liquid is disposed on a nanostructure feature pattern of conical nanoposts 302, as described above, such that the surface tension of the droplet 301 results in the droplet being suspended on the upper portion of the nanoposts 302. In this arrangement, the droplet only covers surface area f, of each nanopost. The nanoposts 302 are supported by the surface of a conducting substrate 303. Droplet 301 is illustratively electrically connected to substrate 303 via lead 304 having voltage source 305. An illustrative nanopost is shown in greater detail in FIG. 4. In that figure, nanopost 302 is electrically insulated from the liquid (301 in FIG. 3A) by material 401, such as an insulating layer of dielectric material. The nanopost is further separated from the liquid by a low surface energy material 402, such as a well-known fluoropolymer. Such a low surface energy material allows one to obtain an appropriate initial contact angle between the liquid and the surface of the nanopost. It will be obvious to one skilled in the art that, instead of using two separate layers of different material, a single layer of material that possesses sufficiently low surface energy and sufficiently high insulating properties could be used.

FIG. 3B shows that by, for example, applying a low voltage (e.g., 10-20 volts) to the conducting droplet of liquid 301, a voltage difference results between the liquid 301 and the nanoposts 302. The contact angle between the liquid and the surface of the nanopost decreases and, at a sufficiently low contact angle, the droplet 301 moves down in the y-direction along the surface of the nanoposts 302 and penetrates the nanostructure feature pattern until it complete surrounds each of the nanoposts 302 and comes into contact with the upper surface of substrate 303. In this configuration, the droplet covers surface area $f_2$ of each nanopost. Since $f_2 >> f_1$, the overall contact area between the droplet 301 and the nanoposts 302 is relatively high and, accordingly, the flow resistance experienced by the droplet 301 is greater than in the embodiment of FIG. 3A. Thus, as shown in FIG. 3B, the droplet 301 effectively becomes stationary relative to the nanostructure feature pattern in the absence of another force sufficient to dislodge the droplet 301 from the feature pattern. Such control is, in part, the subject of copending U.S. patent application Ser. No. 10/403,159, filed Mar. 31, 2003, entitled "Method And Apparatus For Variably Controlling The Movement Of A Liquid On A Nanostructured Surface," and is hereby incorporated by reference herein in its entirety.

In yet another prior attempt, instead of nanoposts or microposts, a closed-cell nanostructured or microstructured surface is used in a way such that, when the pressure of a fluid within one or more of the nanocells or microcells of the surface is decreased, a liquid disposed on that surface is caused to penetrate the surface thus, for example, increasing the flow resistance experienced by the droplet. Such a closed-cell structure is advantageous in that, by increasing the pressure within one or more of the cells to or above a desired level, the liquid is forced back out of the cell(s) and is returned at least partially to its original, unpenetrated, low flow-resistance position. In this way, the penetration of the droplet into the surface can be varied to achieve a desired level of flow resistance experienced by the droplet of liquid. Such reversible penetration is, in part, the subject of copending U.S. patent application Ser. No. 10/674,448, filed Sep. 30, 2003, entitled "Reversible Transitions on Dynamically Tunable Nanostructured or Microstructured Surfaces," and is hereby also incorporated by reference herein in its entirety.

SUMMARY OF THE INVENTION

Prior attempts, such as those described above, involved either reducing the flow resistance of a liquid in contact with a surface or causing the penetration of a liquid between nanostructures or microstructures on a surface to, for example, bring the liquid into contact with the underlying surface. However, the present inventors have realized that, in addition to reducing such flow resistance or causing such penetration, it may be desirable to allow in certain circumstances liquid or other fluids to pass through the substrate supporting the nanostructures or microstructures.

Therefore, we have invented a method and apparatus wherein a nanostructured substrate comprises a plurality of nanostructures with a plurality of substrate openings disposed between those nanostructures. When a desired fluid comes into contact with the substrate, at least a portion of the fluid is allowed to pass through at least one of the openings. In a first embodiment, the fluid is caused to pass through the openings by causing the fluid to penetrate the nanostructures by methods such as those described above. In a second embodiment, the substrate is a flexible substrate so that when a mechanical force is applied to the substrate, such as a bending or stretching force, the distance between nanoposts or the diameter of nanocells on the substrate increases. Upon such an increase, a desired liquid is thus allowed to penetrate the nanoposts or nanocells and, accordingly, to pass through the substrate openings. Finally, in a third embodiment, a first fluid, such as water, is prevented from penetrating the nanostructures on the substrate, as described above, while a second fluid, such as a vapor or gas, is permitted to pass through the substrate via the openings in the substrate.

BRIEF DESCRIPTION OF THE DRAWING

FIGS. 1A, 1B, 1C, 1D and 1E show various prior art nanostructure feature patterns of predefined nanostructures that are suitable for use in the present invention;

DETAILED DESCRIPTION

Figure 3A:
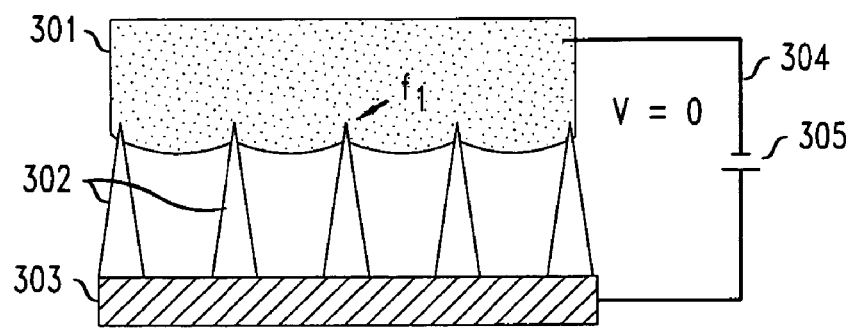
FIGS. 3A and 3B show a device in accordance with the principles of the present invention whereby electrowetting principles are used to cause a liquid droplet to penetrate a nanostructure feature pattern.
Figure 3B:
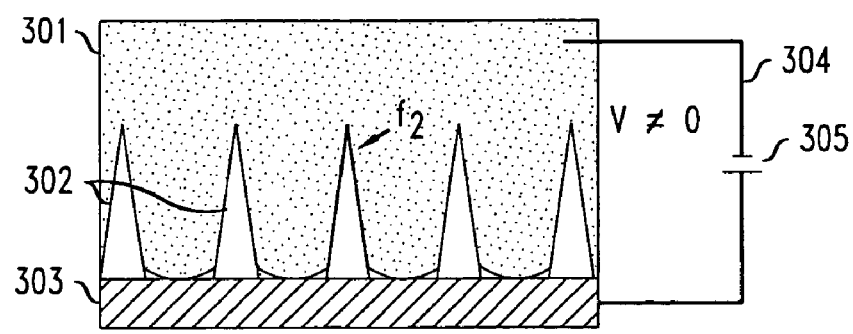
Figure 4:
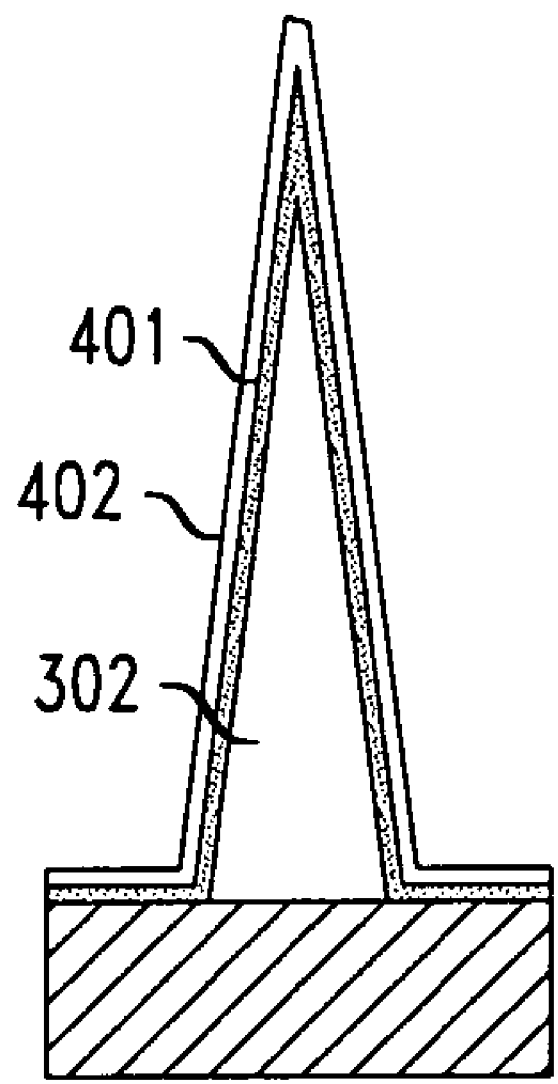
FIG. 4 shows the detail of an illustrative nanopost of the nanostructure feature pattern of FIGS. 3A and 3B.
Figure 5:
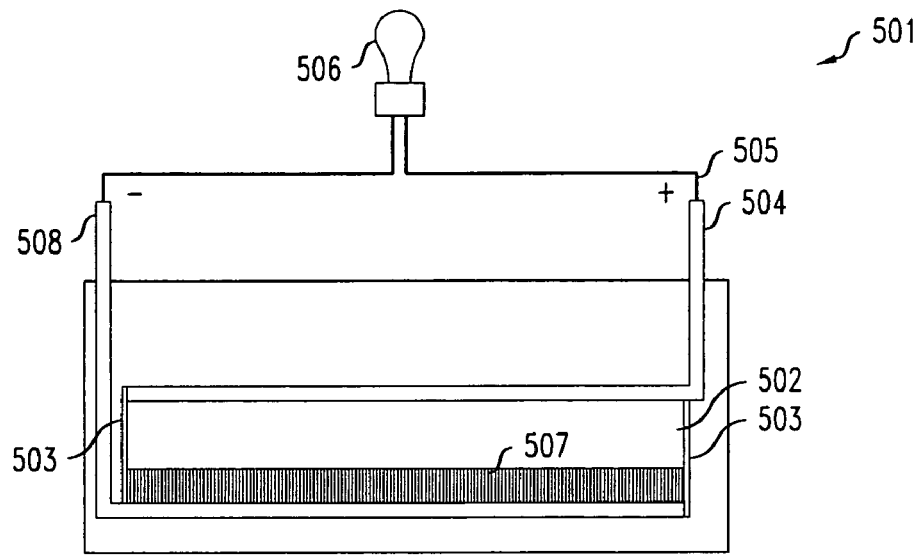
FIG. 5 shows an illustrative liquid-cell battery wherein the electrolyte in the battery is separated from the negative electrode by nanostructures.

FIG. 5 shows one use of the embodiments of FIGS. 3A and 3B wherein an electrolyte fluid in a battery is separated from an electrode until the battery is activated. Such a battery is, in part, the subject of copending U.S. patent application Ser. No. 10/803,641, filed Mar. 18, 2004 and which is hereby incorporate by reference herein in its entirety. In FIG. 5, battery 501 has an electrolyte fluid 502 contained within a housing having containment walls 503. The electrolyte fluid 502 is in contact with positive electrode 504, but is separated from negative electrode 508 by nanostructured surface 507. Nanostructured surface 507 may be the surface of the negative electrode or, alternatively, may be a surface bonded to the negative electrode. One skilled in the art will recognize that the nanostructured surface could also be used in association with the positive electrode with similarly advantageous results. In FIG. 5, the electrolyte fluid is suspended on the tops of the nanoposts of the surface, similar to the droplet of FIG. 3A. The battery 501 is inserted, for example, into electrical circuit 505 having load 506. When the electrolyte liquid 502 is not in contact with the negative electrode, there is substantially no reaction between the electrolyte and the electrodes 504 and 508 of the battery 501.

Figure 6:
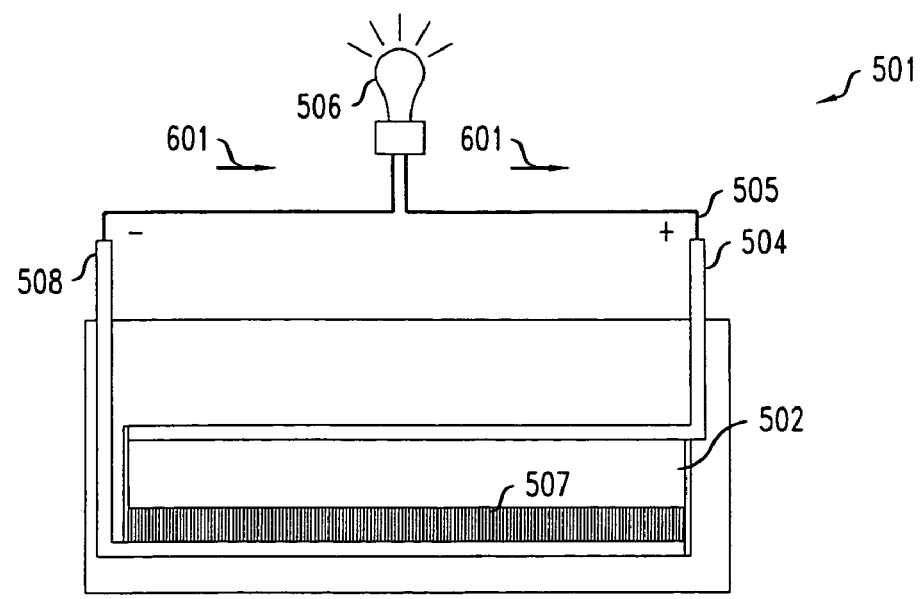
FIG. 6 shows the illustrative battery of FIG. 5 wherein the electrolyte in the battery is caused to penetrate the nanostructures and to thus contact the negative electrode.

FIG. 6 shows the battery 501 of FIG. 5 inserted into electrical circuit 505 wherein, utilizing the electrowetting principles described above, a voltage is applied to the nanostructured surface 507 thus causing the electrolyte fluid 502 to penetrate the surface 507 and to come into electrical contact with the negative electrode 508. One skilled in the art will recognize that this voltage can be generated from any number of sources such as, for example, by passing one or more pulses of RF energy through the battery. When the penetration of the electrolyte into the nanostructures occurs, electrons begin flowing in direction 601 through the circuit 505, as described above, and the load 506 is powered.

As typically defined a "nanostructure" is a predefined structure having at least one dimension of less than one micrometer and a "microstructure" is a predefined structure having at least one dimension of less than one millimeter. However, although the disclosed embodiments refer to nanostructures and nanostructured surfaces, it is intended by the present inventors, and will be clear to those skilled in the art, that microstructures may be substituted in many cases. Accordingly, the present inventors hereby define nanostructures to include both structures that have at least one dimension of less than one micrometer as well as those structures having at least one dimension less than one millimeter. The term "feature pattern" refers to either a pattern of microstructures or a pattern of nanostructures. Further, the terms "liquid," "droplet," and "liquid droplet" are used herein interchangeably. Each of those terms refers to a liquid or a portion of liquid, whether in droplet form or not.

Figure 7A:
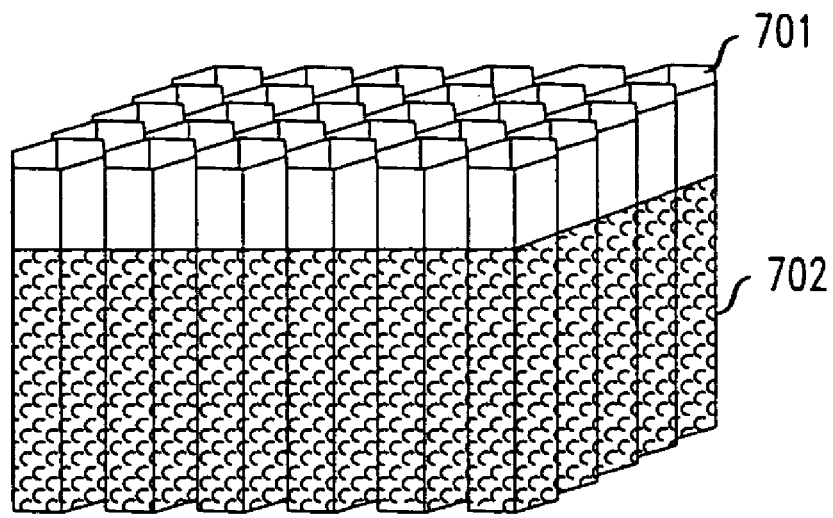
FIGS. 7A and 7B show an illustrative nanocell array.
Figure 7B:
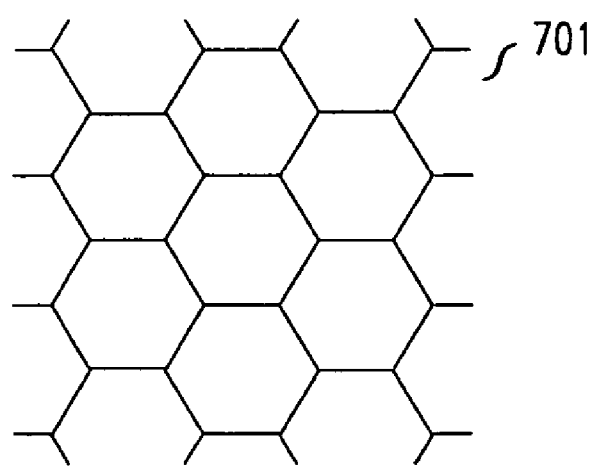

FIGS. 7A and 7B show, respectively, a three-dimensional view and a top cross-sectional view of a nanocell array. As described in the '641 application incorporated herein above, such a nanocell array can be used to achieve reversible penetration of a liquid, such as the electrolyte fluid 502 in FIG. 5, into and out of the nanostructured surface 507. Specifically, in FIGS. 7A and 7B, instead of nanoposts, a number of closed cells 701, here illustrative cells of a hexagonal cross section, are used. Each cell 701 may have, for example, an electrode 702 disposed along the inner wall of the cell. As used herein, the term closed cell is defined as a cell that is enclosed on all sides except for the side upon which a liquid, such as an electrolyte liquid, is intended to be disposed. Such closed cells are advantageous in that a liquid disposed in the cells can be expelled from the cells by, for example, increasing the pressure within the cells. One skilled in the art will recognize that many equally advantageous cell configurations and geometries are possible to achieve equally effective closed-cell arrangements.

Figure 8:
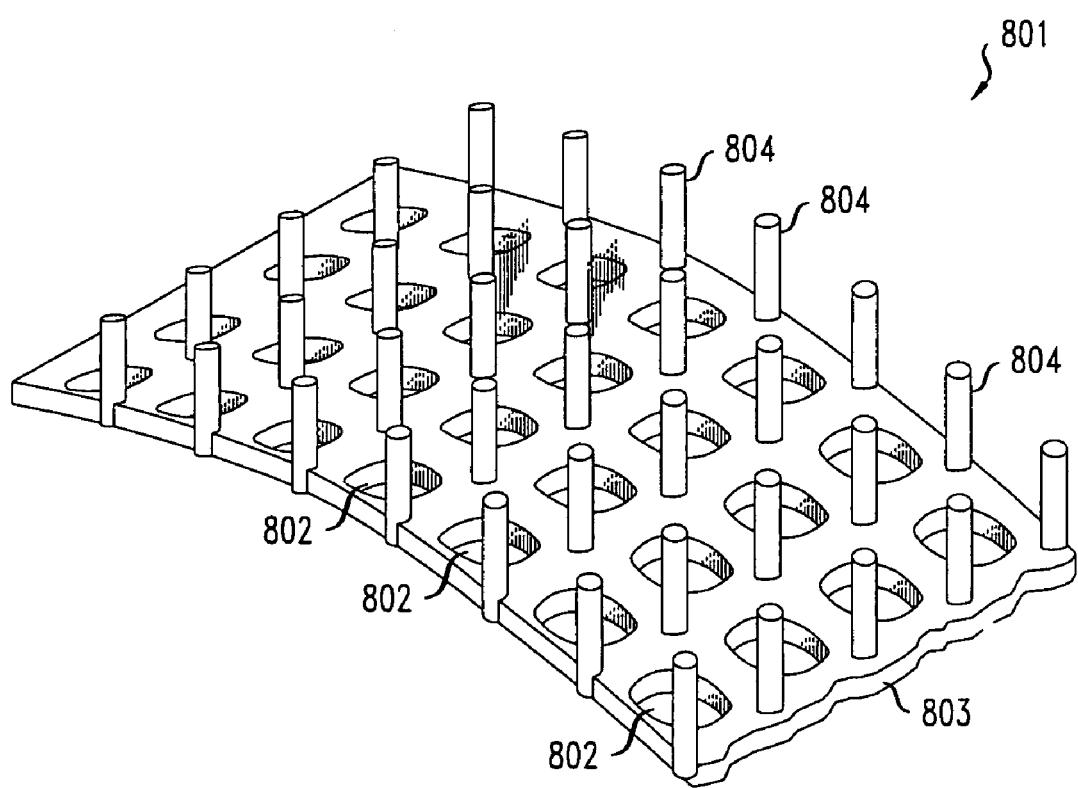
FIG. 8 shows a nanostructured surface in accordance with the principles of the present invention having openings between the nanostructures.

Prior nanostructured surfaces, such as those discussed herein above, have been typically used to either reduce the flow resistance of a liquid disposed on the nanostructures and/or to cause the liquid to penetrate the nanostructures at a desired time and contact the underlying substrate, as in the case of the battery embodiment of FIGS. 5 and 6. However, the present inventors have discovered that in many applications it is desirable to selectively allow a liquid to pass through the underlying substrate upon which nanostructures are disposed. One such surface that will allow such selective passing of a liquid through the surface is shown in FIG. 8. Specifically, FIG. 8 shows a nanostructured surface 801 in accordance with the principles of the present invention whereby a plurality of openings 802 passing through the underlying substrate 803 are disposed between the nanostructures 804 on that substrate. The nanostructures, here nanoposts, are, illustratively, 300 nm in diameter and 7 microns in height and the openings are, illustratively, 2 microns in diameter. One skilled in the art will recognize that many suitable dimensions may be selected for different uses of surfaces similar to that shown in FIG. 8. Similarly, one skilled in the art will also recognize that the nanostructures may be disposed on many suitable substrates, such as a substrate manufactured from a polymer material. Thus, as configured and as discussed herein above, when a liquid is disposed on the nanostructures, as is shown in FIG. 3A, the liquid will not penetrate the nanostructures. However, when the liquid is caused to penetrate the nanostructures and contact the underlying substrate 803, similar to the example shown in FIG. 3B, the liquid will pass through the openings in the substrate.

Figure 9:
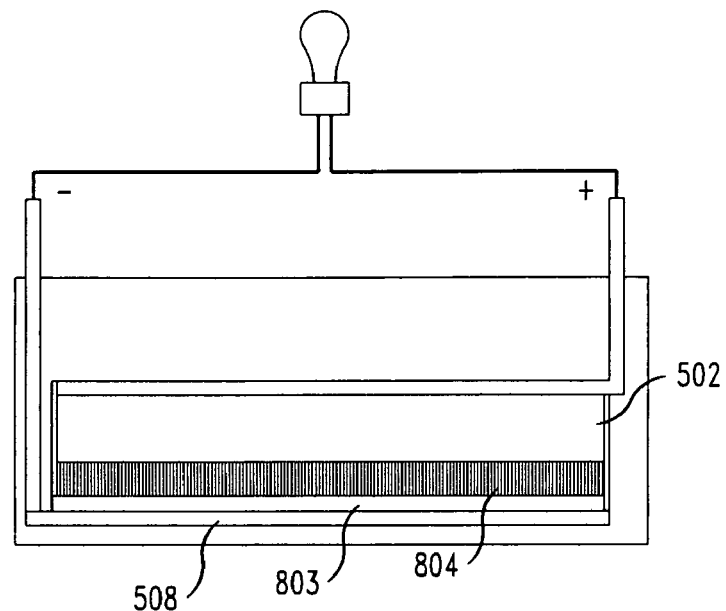
FIG. 9 shows the battery of FIG. 5 having a surface such as the surface of FIG. 8.

FIG. 9 shows one illustrative embodiment in accordance with the principles of the present invention of a battery similar to that shown in FIG. 5 where a surface having openings is advantageously used. Specifically, referring to FIG. 5, as discussed more completely in the '641 application, the battery represented in that figure is manufactured in part by disposing a plurality of nanostructures on the surface of one of the electrodes, illustratively the negative electrode 508 in FIG. 5. However, disposing nanostructures on such an electrode may not be desired due to difficulties in processing or the cost involved in manufacturing such a surface. Therefore, the present inventors have discovered that it is desirable to manufacture a separate nanostructured surface from materials upon which, for example, it is potentially less expensive and/or technologically easier to create nanostructures.

Figure 2:
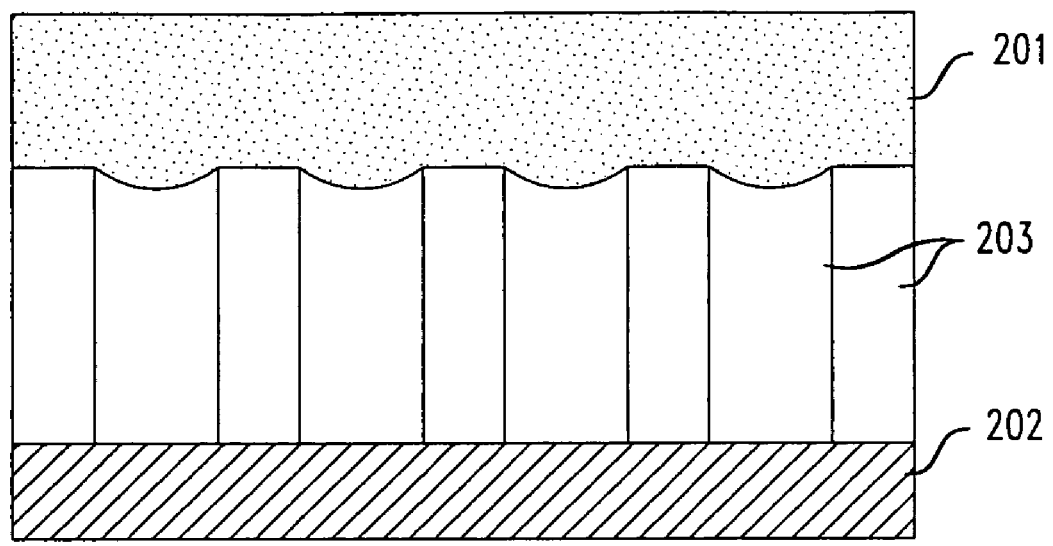
FIG. 2 shows an illustrative prior art device wherein a liquid droplet is disposed on a nanostructured feature pattern

FIG. 9, therefore, shows how the surface of FIG. 8 could be used within a battery application. Specifically, referring to FIG. 9, electrolyte fluid 502 is once again separated by nanostructures from the electrode 508. However, instead of the nanostructures being disposed directly upon the electrode 508, nanostructures 804 are disposed on substrate 803, as is shown in FIG. 8, which is in turn attached to the electrode 508, either directly as shown in FIG. 8 or indirectly. The size of the openings is selected in a way such that, when the electrolyte is caused to penetrate the nanostructures 804, the electrolyte penetrates substrate 803 through openings 802 in FIG. 2 and contacts the electrode 508, thus initiating the chemical reaction with the battery. One skilled in the art will recognize, as discussed more fully in the '641 application, that the nanocells of FIGS. 7A and 7B may be used in place of nanoposts. In such a case, the cells 701 of FIG. 7 could be illustratively manufactured having openings in both ends of the nanocells. Alternatively, a single opening could span multiple cells. Thus, when the nanocell array is attached to, for example, electrode 508 in FIG. 9, the same result could be achieved as if nanoposts were used. Specifically, when the liquid electrolyte is caused to penetrate the nanocells, the liquid will pass all the way through the cells and contact the electrode 508, thus initiating a chemical reaction with in the battery. The nanocell array may be illustratively attached to the electrode in a way such that the electrode entirely covers one end of the cells, thus effectively creating a closed cell array having one end open and the other end entirely sealed due to its attachment to the electrode surface. Accordingly, as discussed more fully above and in the '641 application, the electrolyte may be expelled from the cells at a desired time by, for example, increasing the pressure within the cells.

Figure 10:
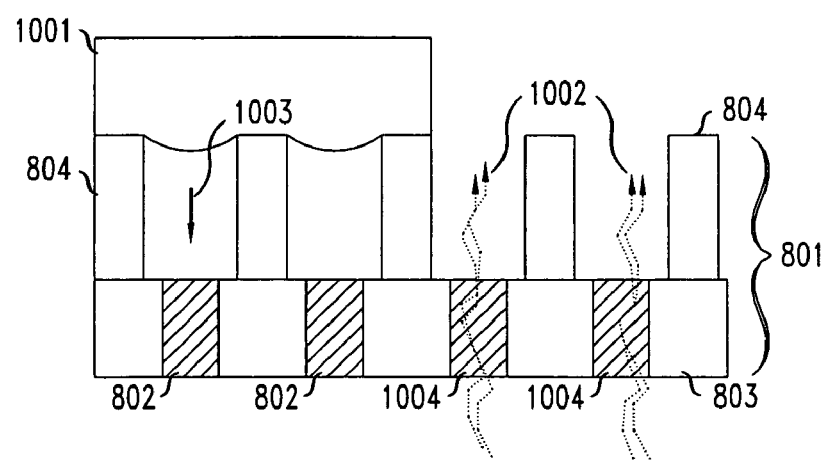
FIG. 10 shows how the surface of FIG. 8 could be used to prevent liquid penetration of the surface while, at the same time, allowing a fluid to pass through the surface.

FIG. 10 shows another embodiment in accordance with the principles of the present invention using the nanostructured surface 801 of FIG. 8. Specifically, as shown in FIG. 10, the substrate 803 is designed such that, when a droplet 1001 of liquid that comes into contact with the surface 801, that droplet will remain disposed on the tips of the nanostructures 804 and, thus, be suspended above the underlying substrate 803. Accordingly, thus disposed, the droplet 1001 will not pass through the openings 802. However, in certain implementations, it may be desirable that a liquid or fluid traveling in direction 1002 be allowed to pass through the substrate 803. For example, liquid resistant, breathable clothing could be created from such a surface. Specifically, the surface 801 shown in FIG. 10 could be sewn or otherwise disposed between two layers of fabric in an article of clothing, much the same way as the water-resistant, breathable fluoropolymer fabric manufactured and sold under the trade name Goretex® by W. L. Gore & Associates, Inc., of Newark, Del. Such clothing would prevent a liquid, such as the water in rain drops, from penetrating the nanostructures and, therefore from penetrating the underlying substrate. Thus, rain would be prevented from traveling in direction 1003 and reaching the skin of the wearer of the clothing. However, while it is desirable to prevent rain from penetrating the fabric, it is desirable to allow other fluids, such as the evaporated perspiration from the wearer, to pass through the fabric in the opposite direction 1002. Such a fluid could easily pass through openings 1004 in the fabric in direction 1002. Thus, a water-resistant, breathable fabric would result.

One skilled in the art will recognize that such a fabric could be advantageously used in other clothing applications, such as, for example, in high-performance swimsuits. A great deal of research has recently been accomplished on low drag swimsuits that can, for example, reduce the drag experienced by professional swimmers as they move through the water. As discussed above, one advantage of nanostructured surfaces is that they can, when appropriately configured, create a very low flow resistance between a liquid, such as water, and the nanostructured surface. When used as the outer fabric in a swimsuit, surface 801 of FIG. 8 would, therefore, result in a low flow resistance as a swimmer moved through the water and, at the same time, allow perspiration to exit through the fabric, as discussed previously.

Figure 11A:
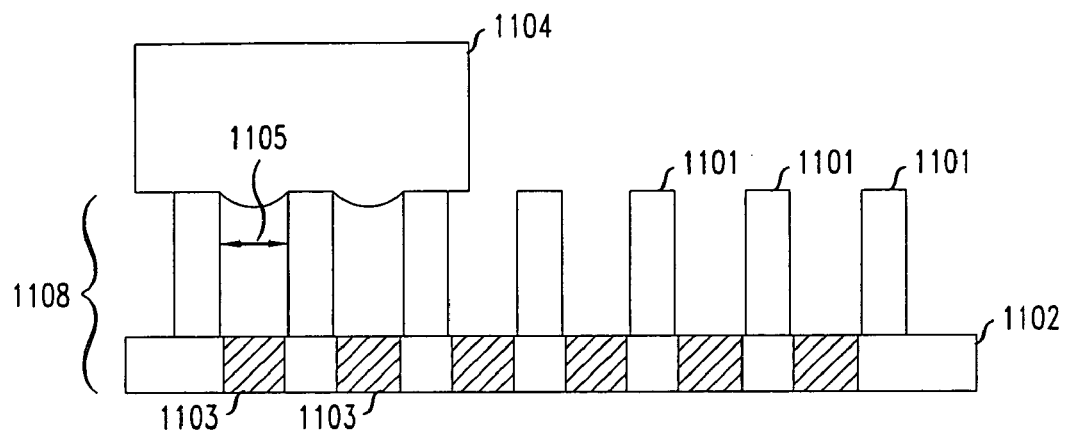
FIGS. 11A and 11B show how a fluid could be caused to penetrate a nanostructured surface by bending or stretching the surface.
Figure 11B:
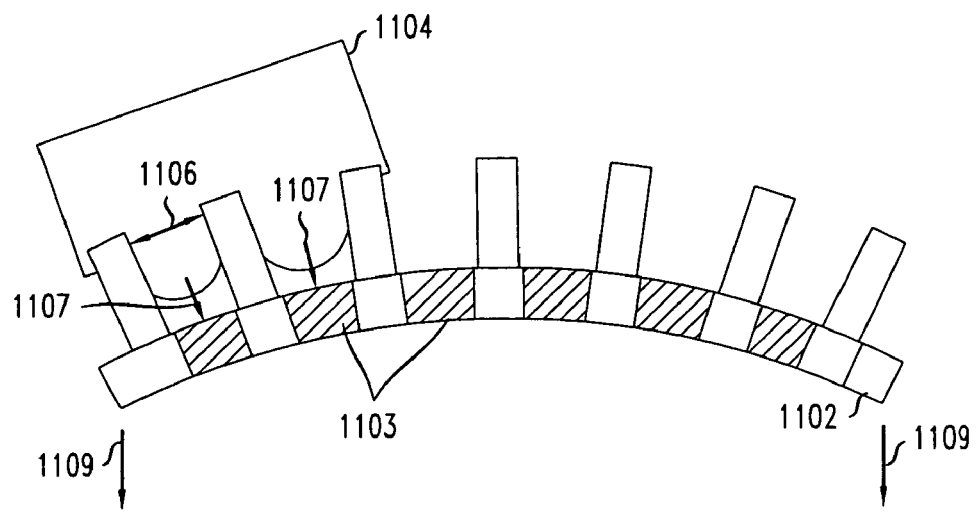

FIG. 11 shows another embodiment in accordance with the principles of the present invention whereby a liquid could be allowed to penetrate the nanostructures of a surface when that surface experiences a mechanical force, such as a bending or stretching force. Specifically, the substrate 1102 of nanostructured surface 1108 is manufactured from a flexible polymer material. Various polymer materials useful for this purpose will be apparent to one skilled in the art in light of the teachings herein. Referring to FIG. 11A, the tops of the nanostructures 1101, here nanoposts, are separated by a distance 1105. As previously discussed, referring to FIG. 11A, when a droplet 1104 of an appropriately-chosen liquid is disposed on the nanostructures 1101, it rests on top of the structures and is suspended above the substrate 1102. However, referring to FIG. 11B, when the surface is bent in directions 1109 or stretched, the separation distance between the nanostructures 1101 increases to distance 1106. Accordingly, at a particular separation distance depending on the liquid, the surface tension of that liquid will be insufficient hold the liquid on the tips of the nanostructures 1101. Accordingly, at that particular separation distance, the liquid 1104 will move in directions 1107 between the nanostructures 1101 and will contact the substrate. As discussed previously, when the liquid 1104 contacts the substrate 1102, openings 1103 will allow at least a portion of the liquid to pass through that substrate.

The nanostructured surface represented by FIGS. 11A and 11B may be useful, illustratively, in containers that are intended to hold liquids. Specifically, a surface such as surface 1108 in FIG. 11A could be used for a portion of one or more walls of such a container. When the pressure within the container is at or below a desired pressure, the liquid is supported by the nanostructures and, therefore, no liquid will pass through the surface. However, when the pressure within the container rises to a predetermined level, the surface will stretch and the distance between the nanostructures will change, as in the example of FIG. 11B. Thus, liquid will pass through the nanostructured surface until the pressure within the container is reduced to the point where the surface is not stretched and the distance between the nanostructures is at least partially restored. In this manner, the pressure within a liquid-holding container can be maintained at or below a desired pressure.

The foregoing merely illustrates the principles of the invention. It will thus be appreciated that those skilled in the art will be able to devise various arrangements which, although not explicitly described or shown herein, embody the principles of the invention and are within its spirit and scope. For example, one skilled in the art, in light of the descriptions of the various embodiments herein, will recognize that the principles of the present invention may be utilized in widely disparate fields and applications. For example, one skilled in the art will recognize that the permeable nanostructured surfaces disclosed herein could be advantageously used in a fuel cell in order to separate the fuel from the rest of the system until a desired time. Other uses will be widely appreciated by those skilled in the art.

All examples and conditional language recited herein are intended expressly to be only for pedagogical purposes to aid the reader in understanding the principles of the invention and are to be construed as being without limitation to such specifically recited examples and conditions. Moreover, all statements herein reciting aspects and embodiments of the invention, as well as specific examples thereof, are intended to encompass functional equivalents thereof.

What is claimed is:

1. Apparatus comprising:
  a substrate having a plurality of openings; and
  a plurality of nanostructures disposed on a surface of said substrate, the plurality of nanostructures being able to suspend a fluid above the surface without the fluid contacting the surface,
  wherein said plurality of openings are disposed between at least a portion of the nanostructures in a way such that at least a portion of said fluid passes through said plurality of openings when the fluid is caused to penetrate the plurality of nanostructures and contact the substrate.

2. The apparatus of claim 1 further comprising a voltage source for applying a voltage differential between said nanostructures and said fluid in a way such that said fluid penetrates said plurality of nanostructures and contacts the surface.

3. The apparatus of claim 1 further comprising means for increasing distance between portions of said nanostructures in a way such that said fluid penetrates said plurality of nanostructures and contacts the surface.

4. The apparatus of claim 1 further comprising means for increasing dimension of said nanostructures in a way such that said fluid penetrates said plurality of nanostructures and contacts the surface.

5. The apparatus of claim 4 wherein said dimension is a diameter of the nanostructures.

6. The apparatus of claim 1 wherein said nanostructures comprise nanoposts.

7. The apparatus of claim 1 wherein said nanostructures comprise nanocells.

8. Apparatus comprising:
  a substrate having a plurality of openings; and
  an array of nanostructures disposed on surface of said substrate,
  wherein said plurality of openings are disposed between said nanostructures such that a first fluid is able to pass through said openings; and
  wherein said array is able to suspend a second fluid above said surface without the second fluid contacting the surface.

9. The apparatus of claim 8 wherein said first fluid comprises a vapor and said second fluid comprises a liquid.

10. A method for use with a substrate having a plurality of nanostructures disposed thereon, said substrate further having a plurality of openings disposed between at least a portion of the nanostructures in said plurality of nanostructures, said method comprising:
  deforming the shape of said substrate in a way such that at least a first dimension related to said nanostructures changes,
  wherein, upon said at least a first dimension changing, a liquid disposed on said nanostructures penetrates said plurality of nanostructures and passes through at least a portion of said plurality of openings.

11. The method of claim 10 wherein said step of deforming comprises stretching said substrate.

12. The method of claim 10 wherein said step of deforming comprises bending said substrate.

13. The method of claim 10 wherein said at least a first dimension comprises a distance between each of a portion of said nanostructures in said plurality of nanostructures.

14. The method of claim 10 wherein at least a first dimension comprises a diameter of a portion of said nanostructures in said plurality of nanostructures.

15. The method of claim 10 wherein said nanostructures comprise nanoposts.

16. The method of claim 10 wherein said nanostructures comprise nanocells.

* * * * *